(12) United States Patent
Goller

(10) Patent No.: US 7,795,717 B2
(45) Date of Patent: Sep. 14, 2010

(54) ELECTRONIC COMPONENT EMBEDDED WITHIN A PLASTIC COMPOUND AND INCLUDING COPPER COLUMNS WITHIN THE PLASTIC COMPOUND EXTENDING BETWEEN UPPER AND LOWER REWIRING LAYERS, AND SYSTEM CARRIER AND PANEL FOR PRODUCING AN ELECTRONIC COMPONENT

(75) Inventor: Bernd Goller, Otterfing (DE)

(73) Assignee: Infineon Technologies AG, Neubiberg (DE)

( * ) Notice: Subject to any disclaimer, the term of this patent is extended or adjusted under 35 U.S.C. 154(b) by 559 days.

(21) Appl. No.: 11/267,589

(22) Filed: Nov. 7, 2005

(65) Prior Publication Data

US 2006/0087044 A1   Apr. 27, 2006

Related U.S. Application Data

(63) Continuation of application No. PCT/DE2004/000934, filed on May 4, 2004.

(30) Foreign Application Priority Data

May 7, 2003  (DE) ................ 103 20 646

(51) Int. Cl.
    H01L 23/02    (2006.01)
    H01L 23/34    (2006.01)
    H01L 23/48    (2006.01)
    H01L 23/52    (2006.01)
    H01L 23/04    (2006.01)
    H01L 23/12    (2006.01)
    H01L 23/053   (2006.01)
    H01L 23/14    (2006.01)
    H01L 23/29    (2006.01)
    H01L 23/31    (2006.01)
    H01L 29/40    (2006.01)

(52) U.S. Cl. .............. 257/686; 257/685; 257/723; 257/690; 257/698; 257/E23.011; 257/687; 257/701; 257/702; 257/E23.119; 257/E23.129; 257/E23.133; 257/777

(58) Field of Classification Search ............. 257/698, 257/724, 789, 700, 685, 686, 701, 702, 678, 257/690, 687, 684, E23.133, E23.01, E23.011, 257/723, E23.119, E23.129, 777

See application file for complete search history.

(56) References Cited

U.S. PATENT DOCUMENTS 5,497,033 A * 3/1996 Fillion et al. ............ 257/723
6,038,133 A * 3/2000 Nakatani et al. ......... 361/760

(Continued)

FOREIGN PATENT DOCUMENTS

DE    103 20 646 A1    9/2004

(Continued)

*Primary Examiner*—Phat X Cao
*Assistant Examiner*—Diana C Garrity
(74) *Attorney, Agent, or Firm*—Edell, Shapiro & Finnan, LLC

(57) ABSTRACT

An electronic component has a first semiconductor chip and a second semiconductor chip that is arranged on a plastic compound in which the first semiconductor chip is embedded. The semiconductor chips are connected to one another by rewiring layers and vias which extend between the rewiring layers, the vias being widened at a transition to one of the rewiring layers.

8 Claims, 4 Drawing Sheets

U.S. PATENT DOCUMENTS

| | | | |
|---|---|---|---|
| 6,054,772 A | 4/2000 | Mostafazadeh et al. | |
| 6,734,534 B1* | 5/2004 | Vu et al. | 257/668 |
| 2002/0060361 A1* | 5/2002 | Sasaki | 257/698 |
| 2002/0066952 A1* | 6/2002 | Taniguchi et al. | 257/698 |
| 2003/0090883 A1* | 5/2003 | Asahi et al. | 361/761 |
| 2003/0137045 A1* | 7/2003 | Sugaya et al. | 257/701 |
| 2004/0232543 A1 | 11/2004 | Goller | |

FOREIGN PATENT DOCUMENTS

| | | |
|---|---|---|
| EP | 0 971 409 A1 | 1/2000 |
| EP | 1 154 474 A1 | 11/2001 |
| WO | WO 03/103042 A2 | 12/2003 |

\* cited by examiner

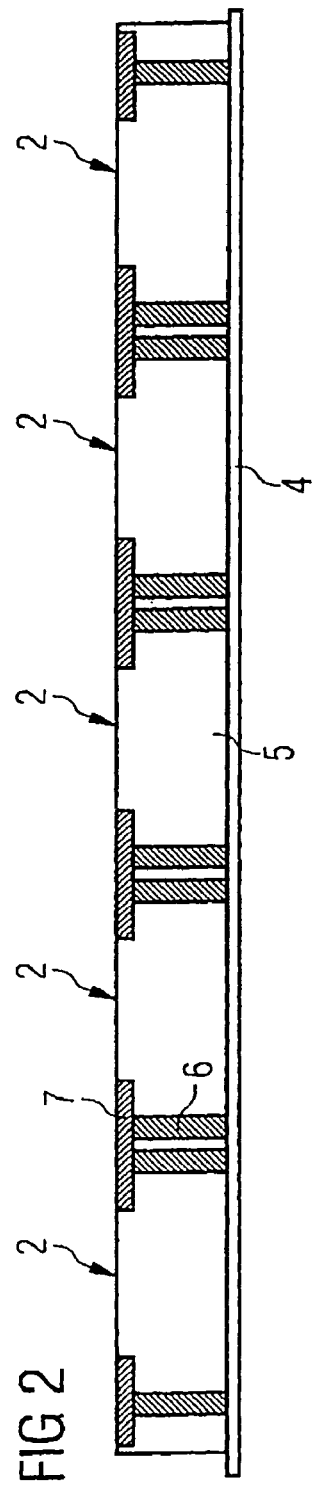
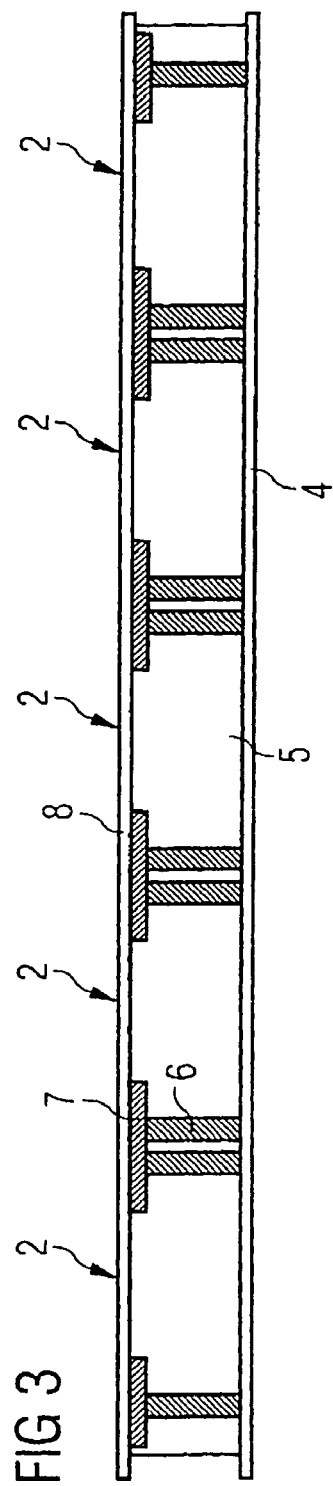
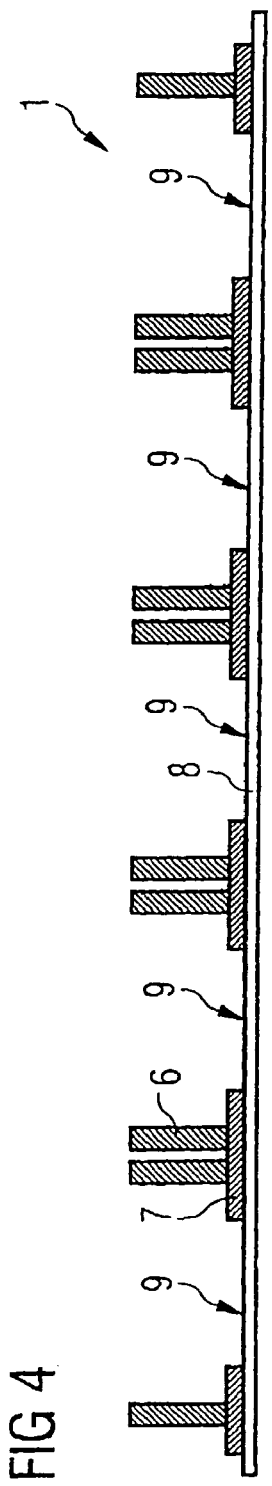

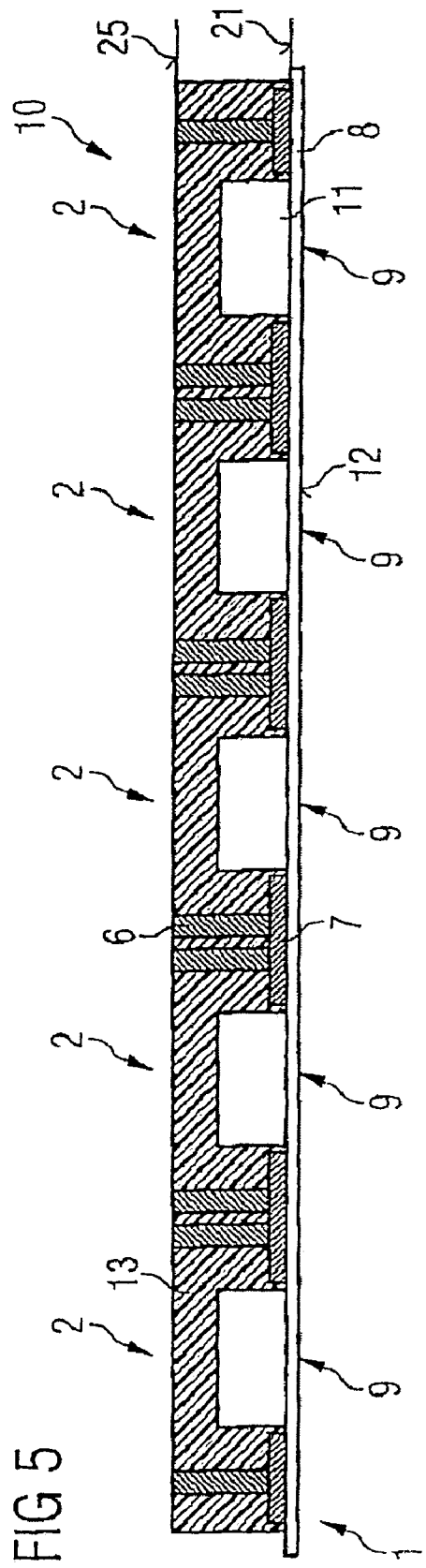
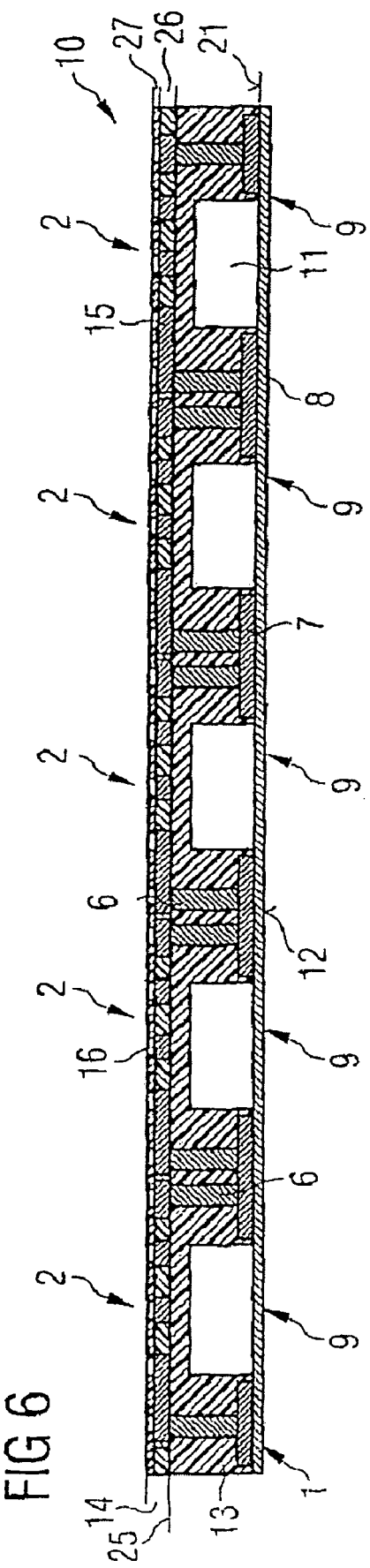

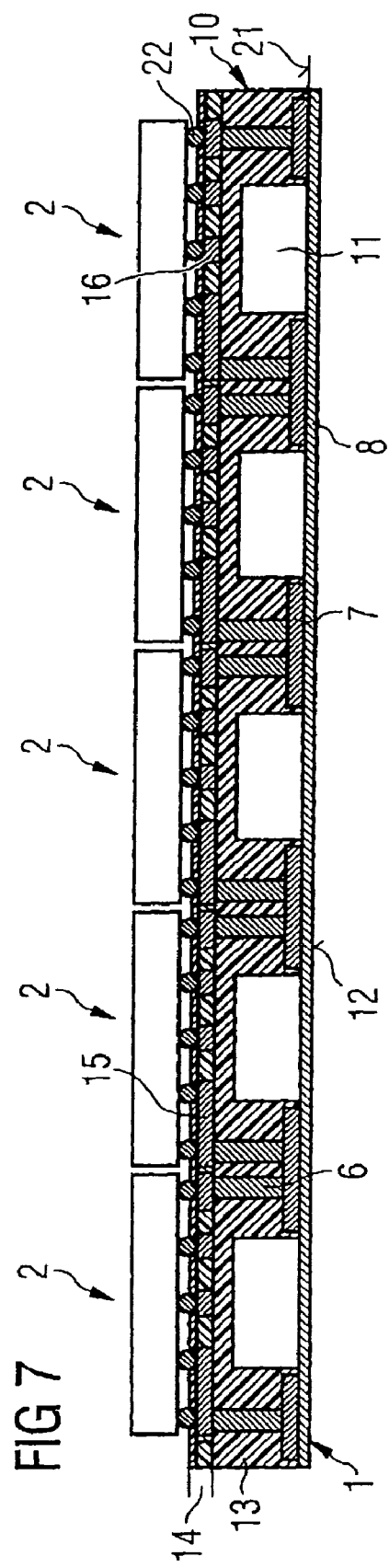
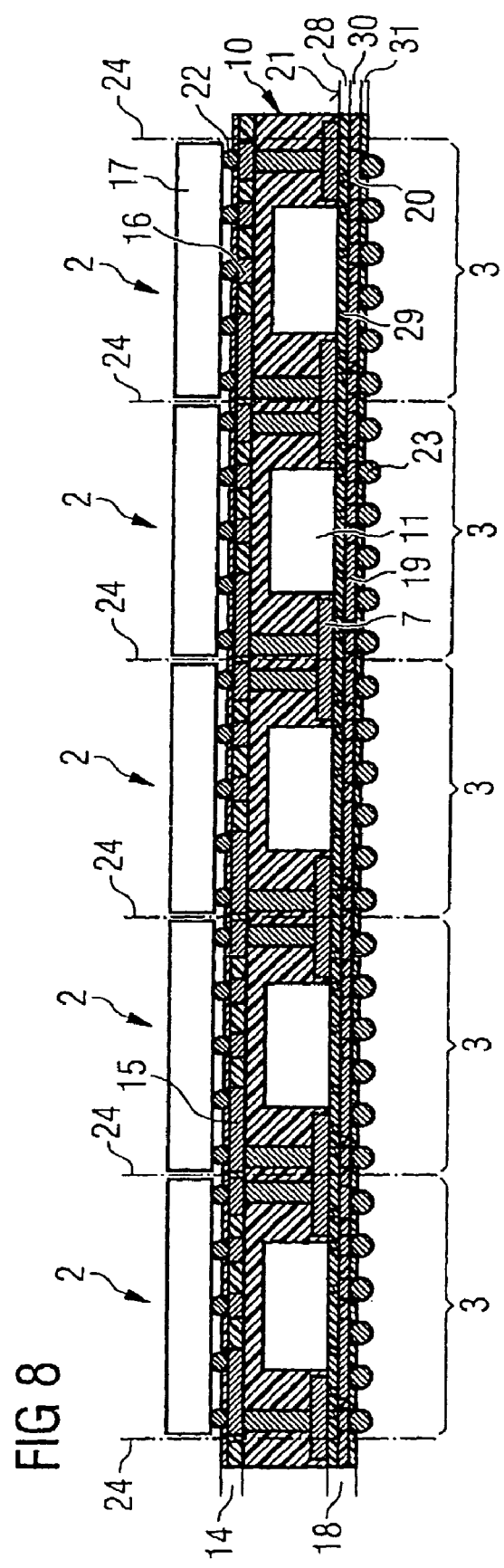

ELECTRONIC COMPONENT EMBEDDED WITHIN A PLASTIC COMPOUND AND INCLUDING COPPER COLUMNS WITHIN THE PLASTIC COMPOUND EXTENDING BETWEEN UPPER AND LOWER REWIRING LAYERS, AND SYSTEM CARRIER AND PANEL FOR PRODUCING AN ELECTRONIC COMPONENT

CROSS REFERENCE TO RELATED APPLICATIONS

This application is a continuation of PCT/DE2004/000934, filed, May 4, 2004, and titled "Electronic Component, and System Carrier and Panel for Producing Said Electronic Component," which claims priority under 35 U.S.C. §119 to German Application No. DE 10320646.9, filed on May 7, 2003, and titled "Electronic Component, and System Carrier and Panel for Producing Said Electronic Component," the entire contents of which are hereby incorporated by reference.

BACKGROUND

Conventional system carriers in the form of flat conductor frames are of complex design, require a large amount of space and cannot contribute to the further miniaturization of electronic components having semiconductor chips.

SUMMARY

The invention relates to an electronic component and to a panel and a system carrier for producing the electronic component, which enable further miniaturization and an increased circuit density for electronic components having semiconductor chips.

According to an exemplary embodiment of the invention, a method for producing a system carrier having compositions, which are arranged in rows and columns and are intended for electronic components, includes coating an auxiliary carrier with a patterned layer having through-holes. Photosensitive layers may be used to produce layers which have been patterned in this manner. Photosensitive layers may be patterned using mask methods, exposure methods, development and fixing methods and may be produced in thicknesses of a few nanometers to several hundred microns. Photosensitive layers of this type can be used to introduce extremely fine structures of between fractions of a micron and several hundred microns into a layer of this type. Patterned layers having coarser patterns and thus also having larger through-holes can be applied using stencil printing or screen printing methods.

Further possible ways of coating an auxiliary carrier with a patterned layer having through-holes involve applying a plastic layer which is then provided with through-holes using laser removal, or applying a patterned layer by printing. Both when coating with subsequent laser removal and when coating an auxiliary carrier by printing, it is not possible to achieve the precision and fineness which are possible with photosensitive layers. To achieve a high degree of miniaturization, use is therefore preferably made of a photosensitive layer and subsequent patterning using mask techniques in order to coat the auxiliary carrier.

After an auxiliary carrier has been coated with a patterned layer having through-holes, the through-holes are filled with conductive material so as to form columnar vias. Through-holes can be filled down to the submicron range by electrodepositing copper alloys. If the auxiliary carrier is made of plastic, the patterned layer having the through-holes which are to be filled is provided, by a sputtering technique, with a metal layer having a thickness of a few nanometers. In the case of an auxiliary carrier made of metal, it is possible to dispense with this preparatory step for filling the through-holes. In the case of through-holes having a diameter of greater than 20 μm, the through-holes can also be filled with a conductive material by vapor-depositing or pressing conductive material into the through-holes.

The vias are then provided with conductive widened portions. During electro-deposition, this widening can be achieved by extending the deposition time. In the case of other filling techniques, it is possible to apply a further patterned layer to achieve these widened portions. Finally, the patterned layer having filled through-holes can be subjected to continuous mirror-coating, and further mask technology steps can be used to pattern this mirror-coating or continuous metallization in such a manner that conductive widened portions are formed above the through-holes in the region of the vias.

A self-supporting, dimensionally stable mold carrier is then applied to the patterned layer and to the widened portions. This mold carrier is so stable that it is not deformed in a subsequent molding method. After the mold carrier has been applied, the auxiliary carrier can be removed.

This is followed by patterning the patterned layer, in which semiconductor chip positions are introduced between the vias at the component positions on the system carrier. This makes it possible to fit semiconductor chips at the component positions on the mold carrier. During this second patterning of the patterned layer, the entire patterned layer may also be removed, for example by subjecting the layer material to plasma incineration. In that case, a system carrier which comprises the mold carrier (with widened portions arranged on the latter) and columnar rods or pins (arranged on the widened portions and made of conductive material) for vias is obtained. If, however, a high degree of miniaturization of the vias is desired, the patterned layer may surround the vias in order to stabilize them mechanically, and only areas of the mold carrier in which the semiconductor chips are to be positioned are exposed.

The widened portions on which the columnar vias stand ensure that the position of the vias on the mold carrier remains fixed and that tilting of the vias, particularly when they are no longer surrounded by a patterned layer, is prevented. A system carrier of this type has the advantage that it is suitable for electronic components having vias from one side of the electronic component to an opposite side of the electronic component. In addition, the system carrier has the advantage that the length of the vias can be matched exactly to the thicknesses of the semiconductor chips in the electronic component. Finally, this system carrier makes it possible, using semiconductor chips which have been ground down, to achieve a high circuit density for electronic components.

In order to produce electronic components of this type, a panel having a plurality of component positions for electronic components is produced. To this end, the following method is performed. The system carrier is fitted with first semiconductor chips at the component positions on the system carrier with the active top sides of the first semiconductor chips being positioned on the mold carrier. The first semiconductor chips and the vias with their widened portions are then embedded in a plastic compound on the mold carrier. Widening ensures that the vias remain upright on the mold carrier and are not displaced or tilted during the molding operation. The first rewiring layer can then be applied to a first plane which is common to the plastic compound and the vias, the first rewiring layer having first rewiring lines between the vias of the system carrier and contact pads for second semiconductor chips which are to be stacked.

In this case, both the contact pads and the rewiring lines to the vias are located in a common rewiring layer. The rewiring layer includes a cover layer which leaves only the contact pads uncovered. A cover layer of this type may be made of polyimide and may be used as a soldering resist so that, when applying a second semiconductor chip to be stacked, the solder from the semiconductor chip contacts of the second semiconductor chip does not wet the rewiring lines or produce short circuits between the rewiring lines.

After the rewiring layer has been applied, the mold carrier can be removed and that area of the panel which is thus freed can be coated with a second rewiring layer having second rewiring lines with external contact areas for electronic components. This second rewiring layer is formed on a plane which is opposite the first rewiring layer and is common to the first semiconductor chips, the widened portions of the vias and the plastic compound.

This second rewiring layer may have three layers, with a first insulating layer which has vias to contact areas for the first semiconductor chip and to the widened portions of the vias being produced. A second layer comprises the actual rewiring structure having rewiring lines to the vias in the insulating layer and to external contact areas in the rewiring layer. A third layer of this second rewiring layer covers the rewiring lines and leaves only the external contact areas in the rewiring layer uncovered. This third layer may simultaneously be in the form of a soldering resist layer.

In addition to the embedded first semiconductor chip and the embedded widened portions and the embedded vias, a panel of this type has an upper, first rewiring layer and a lower, second rewiring layer. This panel can then be fitted with second semiconductor chips on the first rewiring layer and/or can be provided with external contacts on the external contact areas in the second rewiring layer. This method has the advantage that electronic components which are already complete and have stacked semiconductor chips are present at the component positions on the panel, with the result that, in a final separating step, the panel is separated into individual electronic components having stacked semiconductor chips.

An electronic component which has been separated from a panel of this type includes the following features: the electronic component has a first semiconductor chip which is embedded in a plastic compound. In addition, the electronic component has vias which are embedded in the plastic compound and extend, through the component, from a first, upper rewiring layer to a second, lower rewiring layer. In this case, the vias are widened at a transition to the second rewiring layer.

In addition to the first embedded semiconductor chip, the electronic component has a second semiconductor chip having semiconductor chip contacts which are in electrical contact with the first rewiring layer. From the system carrier according to the invention, this electronic component has the columnar vias and the stabilizing widened portions which enlarge contact pads and were produced using the system carrier.

A component of this type has the advantage of a high packing density in conjunction with a simultaneously small housing volume, since the dimensions of the vias can be minimized, and a transition is made from the minimized vias to enlarged external contact areas and/or enlarged contact pads only via the rewiring layers. The columnar shape of the vias in the form of copper rods or copper pins remains unchanged, while the different manufacturing steps, from the system carrier to the finished component, are retained. Only the mold carrier of the system carrier has been removed in the meantime, with the result that it is not present in the finished electronic component, but the widened portion of the vias in a transition region to the mold carrier can still be seen in the finished component.

All of the components from the panel are retained for the electronic component, with the result that the plastic compound of the panel, the stacked semiconductor chips and the vias with widened portions and also the two rewiring layers, both for external contacts and for an additional electronic component, are still present in the finished electronic component.

In summary, the invention is used to provide a three-dimensional system carrier or "via frame" which can be used as a carrier for at least one semiconductor chip at each component position. This advantageously makes it possible for contacts to be routed, outside the area of the first semiconductor chip, to a top side of the housing via the edges of the housing. This results in short signal paths and, in addition, makes it possible to produce very thin housings through which vias pass in edge regions. The three-dimensional system carrier stabilizes handling for the individual method steps for producing electronic components.

The vias (which are provided for the system carrier) with their stabilizing widened portions at the transition to a mold carrier make it possible for rewiring planes and rewiring layers to be provided on both sides of the component housing and for these rewiring layers to be used to route both the electrical connections of a first semiconductor chip and the electrical connections of a stacked second semiconductor chip to the outside to external contacts for the electronic component.

The above and still further objects, features and advantages of the present invention will become apparent upon consideration of the following definitions, descriptions and descriptive figures of specific embodiments thereof wherein like reference numerals in the various figures are utilized to designate like components. While these descriptions go into specific details of the invention, it should be understood that variations may and do exist and would be apparent to those skilled in the art based on the descriptions herein.

BRIEF DESCRIPTION OF THE DRAWINGS

The invention will now be explained in more detail with reference to the appended figures.

FIG. 2 shows a schematic cross section through an auxiliary carrier having a photosensitive layer and vias which have been introduced.

FIG. 3 shows a schematic cross section through an auxiliary carrier (as shown in FIG. 2) having a mold carrier which has been applied.

FIG. 4 shows a schematic cross section through a system carrier in accordance with one aspect of the invention.

FIG. 5 shows a schematic cross section through a panel which is produced using the system carrier shown in FIG. 4.

FIG. 6 shows a schematic cross section through a panel (as shown in FIG. 5) which additionally has a first rewiring layer.

FIG. 7 shows a schematic cross section through a panel (as shown in FIG. 6) which is additionally fitted with second semiconductor chips on the first rewiring layer.

FIG. 8 shows a schematic cross section through a panel (as shown in FIG. 7) which additionally has a second rewiring layer and external contacts.

DETAILED DESCRIPTION

Figure 1:
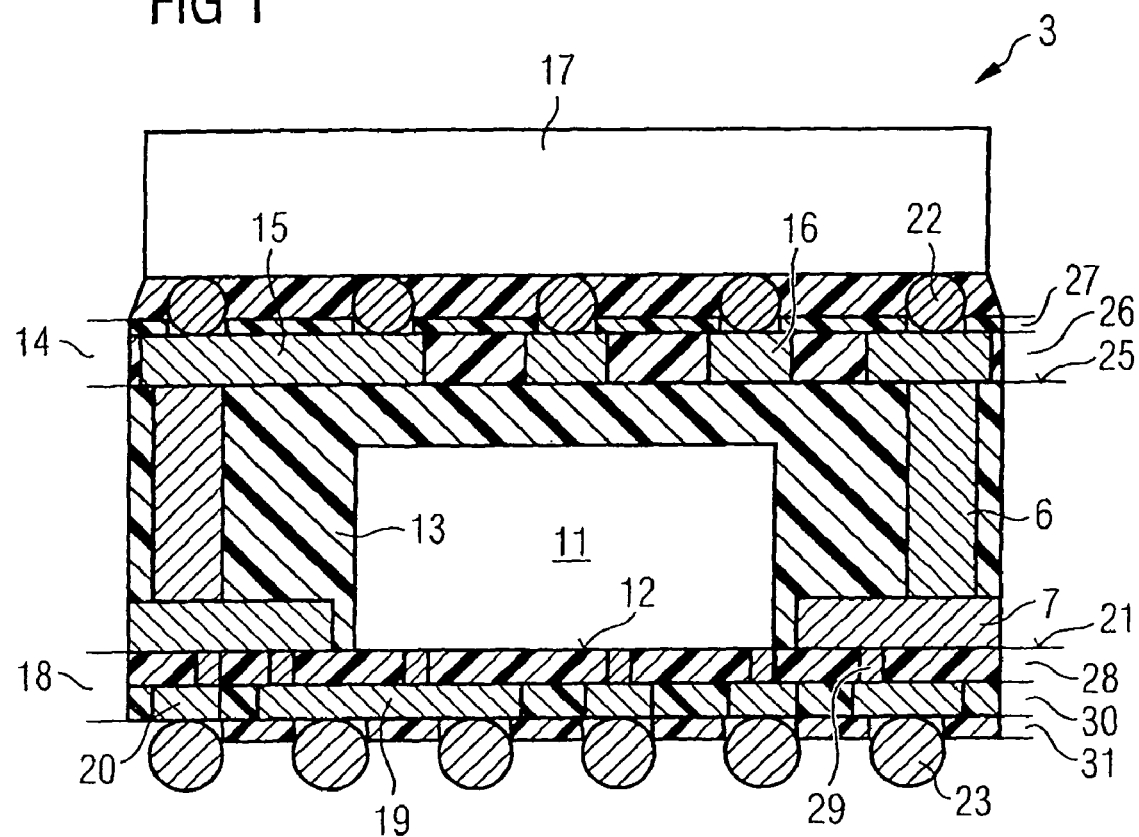
FIG. 1 shows a schematic cross section through an electronic component in accordance with one embodiment of the invention.

FIG. 1 shows a schematic cross section through an electronic component 3 in accordance with an exemplary embodiment of the invention. The electronic component 3 has a first semiconductor chip 11 which is embedded in a plastic compound 13. Columnar vias 6 which are arranged in edge regions of the electronic component 3 are also embedded in the plastic compound. Upper ends of the vias 6 and the plastic compound 13 form a common plane 25, on which a first rewiring layer 14 is arranged.

This rewiring layer 14 has rewiring lines 15 and contact pads 16 in a rewiring layer 26 of the first rewiring layer 14. The rewiring layer 14 has a further layer having the cover layer 27. This cover layer 27 covers the rewiring lines 15, protects them from being wetted with solder material, and leaves only the contact pads 16 uncovered. Semiconductor chip contacts 22 of a second semiconductor chip 17 are arranged on the contact pads 16, the semiconductor chip contacts 22 being connected to corresponding electrodes of the first semiconductor chip 111 via the first rewiring lines 15 and the vias 6.

The top side 12 of the first semiconductor chip 11 forms, with the plastic compound 13, a plane 21 that bears a second rewiring layer 18. This second rewiring layer 18 differs from the first rewiring layer 14 by virtue of the fact that it has three layers. The vias 6 form a widened portion 7 toward the second rewiring layer 18, the widened portion ensuring that the columnar vias 6 are not torn off, bent or displaced when molding the plastic compound 13.

In addition to the plastic compound 13 and the active top side 12 of the first semiconductor chip 11, the common plane 21 has the widened portions 7 of the vias 6. Arranged on this common plane 21 is an insulating layer 28 for the rewiring layer 18, the insulating layer having vias 29 to the widened portions 7 of the vias 6 and to contact areas on the active top side 12 of the first semiconductor chip 11.

Second rewiring lines 19 and external contact areas 20 which are connected to the vias 29 are arranged in a rewiring layer 30 of the second rewiring layer 18. A cover layer 31 covers the second rewiring layer 18. This cover layer 31 is a soldering resist layer which, on the one hand, protects the second rewiring lines 19 and, on the other hand, leaves uncovered the external contact areas 20 on which external contacts 23 for the electronic component 3 are arranged. These external contacts 23 are also used to access the internal semiconductor chip contacts 22 of the second semiconductor chip 17 via the second rewiring layer 18, the vias 6 and the first rewiring layer 14.

FIG. 2 shows a schematic cross section through an auxiliary carrier 4 having a photosensitive layer 5 and vias 6 which have been introduced. FIG. 2 thus shows an intermediate product on the way to forming and producing a system carrier. The auxiliary carrier 4 comprises a metal plate to promote electro-deposition of vias. To this end, a photosensitive layer which is subsequently patterned with through-openings is applied to the auxiliary carrier 4. The through-openings have already been filled with copper in FIG. 2, a widened portion 7 being formed until common plates are formed at the ends of the vias. This widened portion 7 can be dimensioned in a targeted and precise manner if an additional photosensitive layer for configuring these widened portions 7 is applied. During electrodeposition, a widened portion 7 of this type can be automatically achieved by virtue of the electrodeposition process not being ended after the through-openings have been filled with conductive material but rather being continued after the through-openings have been filled.

Note that in the exemplary embodiment shown in FIG. 2, the widened portion 7 extends in along a plane that is substantially perpendicular to the lengthwise axis of the vias 6, thereby forming a structure with the vias 6 that has a substantially T-shaped cross section. In the non-limiting example shown in FIG. 2, each widened portion 7 essentially serves as a base for two vias 6, such that two vias 6 extend from the widened portion 7 in a double-T-shaped configuration. As shown in FIG. 2, the surfaces of the widened portions 7, in the direction away from vias 6, lie in a plane and form a planar surface with the remaining portion of photosensitive layer 5.

FIG. 3 shows a schematic cross section through an auxiliary carrier 4 (as shown in FIG. 2) having a mold carrier 8 which has been applied. The mold carrier 8 is self-supporting and dimensionally stable and can withstand deformation by an injection molding method. The mold carrier 8 covers the common plane comprising the photosensitive layer material and the widened portions 7. This mold carrier 8 is applied to the photosensitive layer 5 and to the widened portion 7 of the vias 6 using adhesive or a double-sided adhesive film. The structure comprising the widened portion 7 and the vias 6 makes the columnar vias 6 more stable and very stationary on the mold carrier 8.

FIG. 4 shows a schematic cross section through a system carrier 1 in accordance with one aspect of the invention. In order to produce a system carrier (shown in FIG. 4) on the basis of FIG. 3, two steps are required, namely, firstly, the auxiliary carrier 4 shown in FIG. 3 is removed and, secondly, the photosensitive layer is likewise removed. The auxiliary carrier can be etched away from the photosensitive layer using a metal etchant.

The photosensitive layer is removed by plasma incineration, with the result that the vias 6 in the form of copper rods or copper pins stand on the mold carrier 8 (as shown in FIG. 4) and are stabilized, in terms of their orientation, by the widened portions 7. That is, widened portions 7 are coupled to mold carrier 8 and extend substantially parallel to the surface of mold carrier 8 to provide a stable base for one or more vias 6, which extend substantially perpendicular to the planar surface of mold carrier 8. In the case of vias having a diameter of only a few microns or submicrons, the sensitive layer is not completely incinerated but rather is patterned in such a manner that semiconductor chip positions 9 are exposed on the mold carrier 8, while the vias are supported and protected by the remaining photosensitive layer.

FIG. 5 shows a schematic cross section through a panel 10 which is produced using the system carrier 1 shown in FIG. 4. To this end, the system carrier 1 is fitted with first semiconductor chips 11 at the component positions 2, the active top sides 12 of the semiconductor chips 11 being arranged on the mold carrier 8. The system carrier 1 is then filled with a plastic compound 13, with the result that the ends of the vias 6 and the plastic or molding compound 13 form a common plane 25. In this case, the back and edge faces of the first semiconductor chips 11 are completely covered by plastic compound 13.

FIG. 6 shows a schematic cross section through a panel 10 (as shown in FIG. 5) which additionally has a first rewiring layer 14. This first rewiring layer 14 is applied to the common plane 25 comprising the plastic compound and the vias 6. In this embodiment of the invention, the first rewiring layer 14 has two layers: a rewiring layer 26 which forms a rewiring structure comprising rewiring lines 15 with contact pads 16;

and a cover layer 27 that covers rewiring layer 26, leaving only the contact pads 16 freely accessible.

FIG. 7 shows a schematic cross section through a panel 10 (as shown in FIG. 6) which is additionally fitted with second semiconductor chips 17 in the first rewiring layer 14. These second semiconductor chips 17 have semiconductor chip contacts 22 which are connected to the contact pads 16 in the first rewiring layer 14. These contact pads 16 and thus the semiconductor chip contacts 22 are electrically connected to the vias 6 via the rewiring lines 15. The cavity between the semiconductor chip contacts 22, the active top side of the semiconductor chip 17, and the first rewiring layer 14 is filled with a suitable adhesive or a suitable plastic.

FIG. 8 shows a schematic cross section through a panel 10 (as shown in FIG. 7) which additionally has a further rewiring layer 18 and external contacts 23. This additional second rewiring layer 18 differs from the first rewiring layer 14 by virtue of the fact that it has three layers, namely, an insulating layer 28 having vias 29 to the widened portions 7 and to contact areas on the first semiconductor chip 11. The middle layer of the second rewiring layer 18 is a rewiring layer 30 having second rewiring lines 19 and external contact areas 20. Finally, this rewiring layer 30 is covered by a cover layer 31 which leaves uncovered only external contact areas 20 on which external contacts 23 are arranged. With FIG. 8, the panel according to the invention is completed and can be separated into individual electronic components (as shown in FIG. 1) along the separating tracks 24.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

What is claimed is:

1. An electronic component, comprising:
   a first semiconductor chip embedded in a plastic compound;
   vias embedded in the plastic compound and extending through the electronic component from a first, upper rewiring layer to a second, lower rewiring layer, wherein the vias are widened at a transition to the second rewiring layer and include columnar portions that extend from the transitions at which the vias are widened toward the first, upper rewiring layer so as to form upper ends of the vias, each columnar portion having a substantially uniform cross-sectional dimension along the length of the columnar portion, the upper ends of the vias form a common plane with a corresponding upper end of the plastic compound, and the first, upper rewiring layer includes rewiring lines and contact pads and is disposed directly on the common plane defined by the upper ends of the vias and the upper end of the plastic compound; and
   a second semiconductor chip including semiconductor chip contacts, wherein the second semiconductor chip is in electrical contact with the first rewiring layer;
   wherein an active top side of the first semiconductor chip forms a common plane with a corresponding lower end of the plastic compound.

2. The electronic component according to claim 1, wherein the vias comprise columnar copper rods.

3. The electronic component according to claim 1, wherein the second rewiring layer comprises external contact areas for external contacts for the electronic component.

4. A panel, comprising:
   a composite board including component positions for a plurality of electronic components according to claim 1, the component positions being arranged in rows and columns, the composite board comprising: a plastic compound, stacked semiconductor chips, rewiring layers, vias having widened portions to one of the rewiring layers, and external contacts for the electronic components.

5. A system carrier, comprising:
   component positions for a plurality of electronic components according to claim 1, the component positions being arranged in rows and columns; and
   copper rods which extend from a mold carrier and are configured to extend through the vias of the electronic components, the vias being widened at a transition to the mold carrier.

6. The electronic component of claim 1, wherein the second, lower rewiring layer is disposed on the common plane defined by the active top side of the first semiconductor chip and the corresponding lower end of the plastic compound.

7. The electronic component of claim 3, wherein contact areas of an active top side of the first semiconductor chip are connected to the external contact areas of the second, lower rewiring layer by vias disposed in an insulating layer of the second, lower rewiring layer.

8. The electronic component of claim 1, wherein the first, upper rewiring layer includes a first layer including the rewiring lines and contact pads and a second layer disposed over the first layer to cover the rewiring lines.

* * * * *